United States Patent
Monson et al.

(10) Patent No.: US 9,913,368 B2
(45) Date of Patent: Mar. 6, 2018

(54) NANOWIRE SECURITY FILMS

(71) Applicant: Carestream Health, Inc., Rochester, NY (US)

(72) Inventors: Robert J. Monson, Roseville, MN (US); Andrew T. Fried, Woodbury, MN (US)

(73) Assignee: Carestream Health, Inc., Rochester, NY (US)

( * ) Notice: Subject to any disclaimer, the term of this patent is extended or adjusted under 35 U.S.C. 154(b) by 228 days.

(21) Appl. No.: 14/997,706

(22) Filed: Jan. 18, 2016

(65) Prior Publication Data

US 2016/0219694 A1    Jul. 28, 2016

Related U.S. Application Data

(60) Provisional application No. 62/106,264, filed on Jan. 22, 2015.

(51) Int. Cl.
  *H01H 35/14* (2006.01)
  *H05K 1/02* (2006.01)
  *H05K 1/09* (2006.01)
  *H05K 3/28* (2006.01)

(52) U.S. Cl.
  CPC .......... *H05K 1/0224* (2013.01); *H05K 1/097* (2013.01); *H05K 3/284* (2013.01); *H05K 2201/026* (2013.01); *H05K 2201/0715* (2013.01)

(58) Field of Classification Search
  None
  See application file for complete search history.

(56) References Cited

U.S. PATENT DOCUMENTS

| | | |
|---|---|---|
| 4,300,184 A | 11/1981 | Colla |
| 5,350,594 A | 9/1994 | Unruh |
| 7,118,693 B2 | 10/2006 | Glatkowski et al. |
| 7,261,950 B2 | 8/2007 | Fleming et al. |
| 7,351,479 B2 | 4/2008 | Funkenbusch et al. |
| 8,493,749 B2 | 7/2013 | Myers et al. |

(Continued)

FOREIGN PATENT DOCUMENTS

WO    WO 03/013199 A2    2/2003

OTHER PUBLICATIONS

C Ducamp-Sanguesa et al., "Synthesis and Characterization of Fine and Monodisperse Silver Particles of Uniform Shape," Journal of Solid State Chemistry, 100, pp. 272-280, 1992.

(Continued)

*Primary Examiner* — Cassandra Cox
(74) *Attorney, Agent, or Firm* — Reed L. Christiansen

(57) ABSTRACT

Articles and related methods, the article having an enclosed area at least partially surrounded by a visible light-transmissive protective film comprising a first visible light-transmissive flexible film, a second visible light-transmissive flexible film, and a visible light-transmissive patterned conductive layer interposed between the first visible light-transmissive flexible film and the second visible light-transmissive flexible film, the visible light-transmissive conductive layer comprising a dispersion of metal nanowires within a polymeric matrix having an average pore size among metal nanowires that is impenetrable by electromagnetic radiation having a wavelength greater than 1 mm.

16 Claims, 2 Drawing Sheets

(56) References Cited

U.S. PATENT DOCUMENTS

| | | | |
|---|---|---|---|
| 8,551,211 B2 | 10/2013 | Ollmann et al. | |
| 9,774,010 B2* | 9/2017 | Okuno | H01L 51/5271 |
| 2002/0093766 A1 | 7/2002 | Wachtler | |
| 2009/0104434 A1 | 4/2009 | Lalli | |
| 2009/0129004 A1* | 5/2009 | Gruner | H01L 31/02246 |
| | | | 361/679.21 |
| 2011/0085316 A1 | 4/2011 | Myers et al. | |
| 2012/0063948 A1 | 3/2012 | Ramsden et al. | |
| 2012/0126181 A1 | 5/2012 | Whitcomb et al. | |
| 2012/0148436 A1 | 6/2012 | Whitcomb et al. | |
| 2012/0328469 A1 | 12/2012 | Zhang et al. | |
| 2014/0138125 A1* | 5/2014 | Iwase | H05K 1/092 |
| | | | 174/251 |
| 2015/0185890 A1* | 7/2015 | Kaneko | G06F 3/044 |
| | | | 428/457 |
| 2015/0205178 A1* | 7/2015 | Paolini, Jr. | G09G 3/34 |
| | | | 359/238 |

OTHER PUBLICATIONS

Yugang Sun et al., "Uniform Silver Nanowires Synthesis by Reducing $AgNO_3$ with Ethylene Glycol in the Presence of Seeds and Poly(Vinyl Pyrrolidone)," Chem. Mater., 2002, 14, pp. 4736-4745.

Yugang Sun et al., "Polyol Synthesis of Uniform Silver Nanowires: A Plausible Growth Mechanism and the Supporting Evidence," American Chemical Society, NANO Letters, 2003, vol. 3, No. 7, pp. 955-960.

\* cited by examiner

NANOWIRE SECURITY FILMS

CROSS REFERENCE TO RELATED APPLICATIONS

This application claims the benefit of U.S. Provisional Application No. 62/106,264, filed Jan. 22, 2015, entitled "NANOWIRE SECURITY FILMS," which is hereby incorporated by reference in its entirety.

BACKGROUND

As we rely more on electronic devices to store and transfer data, there is a desire to develop technologies that provide security to this data, especially improved security technologies compatible with improved electronic devices. Data security is important in both consumer and government electronics. In fact, all current and future government contracts relating to software and electronics have an implicit requirement for system security.

Electromagnetic interference (EMI) films may be developed to block the transmission of undesired electromagnetic energy into or out of electronic equipment. See, for example, U.S. Pat. No. 7,118,693 to Glatkowski et al., U.S. Pat. No. 7,261,950 to Fleming et al., U.S. Pat. No. 7,351,479 to Funkenbusch et al., and PCT International Publication No. WO 03/013199 to Eikos, Inc. EMI films may be in the form of conformal coatings. See, for example, U.S. Pat. No. 4,300,184 to Colla, U.S. Pat. No. 5,350,594 to Unruh, U.S. Pat. No. 8,493,749 to Myers et al., U.S. Patent Application Publication No. 2002/0093766 to Wachtler, U.S. Patent Application Publication No. 2009/0104434 to Lalli, and U.S. Patent Application Publication No. 2011/0085316 to Myers et al.

SUMMARY

At least a first embodiment provides an article comprising an enclosed area at least partially surrounded by a visible light-transmissive protective film comprising a first visible light-transmissive flexible film, a second visible light-transmissive flexible film, and a visible light-transmissive patterned conductive layer interposed between the first visible light-transmissive flexible film and the second visible light-transmissive flexible film, the visible light-transmissive conductive layer comprising a dispersion of metal nanowires within a polymeric matrix having an average pore size among metal nanowires that is impenetrable by electromagnetic radiation having a wavelength greater than 1 mm.

The enclosed area is, in some embodiments, completely enclosed within the visible light-transmissive protective film. The enclosed area, in some embodiments, comprises at least one electronic circuit. The enclosed area, in some embodiments, comprises an electronic circuit board, and the electronic circuit board contacts the visible light-transmissive protective film in at least one point of contact. The enclosed area, in some embodiments, comprises an electronic circuit board, and the electronic circuit board contacts the visible light-transmissive protective film. The enclosed area, in some embodiments, comprises an electronic circuit board, and the electronic circuit board continuously contacts surfaces of the visible light-transmissive film.

At least a second embodiment provides a method of using an electronics circuit board at least partially surrounded by a visible light-transmissive protective film comprising a first visible light-transmissive flexible film, a second visible light-transmissive flexible film, and a visible light-transmissive patterned conductive layer interposed between the first visible light-transmissive flexible film and the second visible light-transmissive flexible film, the visible light-transmissive conductive layer comprising a dispersion of metal nanowires within a polymeric matrix, the method comprising comparing a measured value of a property of the visible light-transmissive protective film after receiving an instruction from the electronics circuit board with a stored value of the property of the visible light-transmissive protective film prior to receiving the instruction, and determining whether the measured value of the property is within a predetermined threshold of the stored value of the property.

At least some such methods further comprise preventing access to data stored on the electronics circuit board if the measured value of the property is outside the predetermined threshold of the stored value of the property; or deleting data stored on the electronics circuit board if the measured value of the property is outside the predetermined threshold of the stored value of the property; or destroying the electronics circuit board if the measured value of the property is outside the predetermined threshold of the stored value of the property.

In some such methods, the predetermined threshold is ±10% of the stored value of the property, or ±5% of the stored value of the property.

In some such methods, the property is selected from the group consisting of impedance, resistance, or capacitance.

These and other embodiments may be better understood by referring to the figures, description of figures, description, exemplary embodiments, and claims that follow.

DESCRIPTION

All publications, patents, and patent documents referred to in this document are incorporated by reference in their entirety, as though individually incorporated by reference.

U.S. Provisional Application No. 62/106,264, filed Jan. 22, 2015, entitled "NANOWIRE SECURITY FILMS," is hereby incorporated by reference in its entirety.

Protective Film

Figure 1:
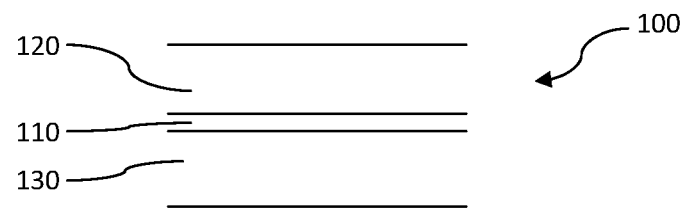
FIG. 1 is a side view of a protective film.

FIG. 1 is a side view of a protective film. The protective film 100 comprises a conductive layer 110 interposed between a first flexible film 120 and a second flexible film 130. In some embodiments, the conductive layer 110 has been patterned to form regions exhibiting different resistivity (or conductivity) or different capacitance (e.g. isolating regions within non-isolating regions). The protective film may form a housing for protecting an article. In such cases, the housing may be formed by an enclosed area that is at least partially surrounded by the protective film. The protective film may be attached to the surface of the article (e.g. the support on which electronic components are attached to form an electronic circuit board), forming an enclosure around some or all of the electronic components. The protective film may completely enclose the electronic circuit board. The protective film may serve several purposes, including, for example, protecting the article (e.g. electronic circuit board) from environmental elements (e.g. moisture, dust, vibrations, temperatures extremes, electrostatic discharge, and chemicals that could damage or cause electronics to malfunction), blocking transmission of undesired electromagnetic energy, and preventing tampering of the enclosed article.

The protective film may be designed to block the transmission of undesired electromagnetic energy through the protective film. Sensitive or confidential data may be extracted from electromagnetic energy emitted from the article, such as an electronic circuit board. Electromagnetic energy emitted from the article (e.g. medical devices, cell phone, etc.) may affect the performance of nearby devices. The conductive layer of the protective film may comprise conductive structures (e.g. silver nanowires) dispersed within a matrix. The dispersion of conductive structures within the matrix may be modified (e.g. increasing or decreasing the amount of conductive structures) to afford an average porosity or average pore size among conductive structures to be impenetrable by certain types of electromagnetic radiation. Electromagnetic radiation may be characterized by such properties as wavelength, frequency, and amplitude. For a particular sinusoidal wave, the wavelength is the distance of propagation during one period of the wave and the frequency is the number of waves that pass a point in space during a unit of time. More complicated waveforms may be characterized as a superposition of simpler sinusoidal waves, each with its own wavelength and frequency, as would be understood by one skilled in the art. Amplitude refers to the maximum displacement of the periodic wave from its time-average (neutral) position, regardless of the particular frequency content of the wave. In some embodiments, the average porosity or average pore size among conductive structures may be impenetrable to all electromagnetic radiation except those with very short wavelengths (e.g. super high frequencies or extremely high frequencies) since they will probably not travel far enough to be intercepted if emitted through the protective film. In some cases, the protective film may be substantially impenetrable by radio waves and microwaves. Radio waves may have wavelengths between about 1 mm and about 100 km or frequencies from about 3 kHz to about 300 GHz. Microwaves may have wavelengths between about 1 m and about 1 mm or frequencies from about 300 MHz and about 300 GHz.

Other approaches to making the protective film impenetrable to certain electromagnetic energy include, for example, using different materials for the components (e.g. conductive structures, matrix, first film, second film, etc.) of the protective film, varying the thickness of the protective film (or its components, such as the conductive layer, the first flexible film, or the second flexible film), varying the size of the enclosed area, varying the frequency or wavelength of emitted electromagnetic energy, and varying the size, shape, or orientation of the pores formed among the dispersion of conductive structures. These approaches may also affect the extent to which the enclosed article may be affected by environmental elements or provide the protective film with other desirable features. For example, selecting a polymer having high heat capacity for the matrix, the first flexible film, and/or the second flexible film or varying the thickness of the protective film (via the conductive layer, the first flexible film, and/or the second flexible film) may aid in thermal transfer from the electronic circuit board to the environment, either directly or via a heat sink or thermal dispersion layer, which may prevent overheating of the electronic circuit board.

It may be desirable that the contents of the enclosed area be viewable. In some embodiments, the protective film, the conductive layer, the first film, and/or the second film may be light-transmissive. By "light-transmissive," we mean that the support, layer, film, or article has an average transmission, T, in a spectral range of at least about 20% measured along the normal axis. In some embodiments, the protective film, the first film, and/or second film may be visible light-transmissive. By "visible light-transmissive," we mean that the support, layer, film, or article has a transmission, $T_{vis}$, in the visible portion of the spectrum of at least about 20% measured along the normal axis. In some embodiments, the protective film, the conductive layer, the first film, and/or the second film may be "optically clear" or "optically transparent." In such cases, the protective film may be invisible or undetectable by the naked eye. By "optically clear" or "optically transparent," we mean that light transmission of the material is at least 80% in the visible region (approximately 400 nm to 700 nm) or there is an absence of visibly noticeable haze or flaws as detected by the naked eye at a distance of about 0.5 or 1 meter.

Conductive Structures

The conductive structures can be formed from any conductive material. In some cases, conductive structures are made from a metallic material, such as elemental metal (e.g. transition metal) or a metal compound (e.g. metal oxide). The metallic material can also be a bimetallic material or metal alloy, which comprises two or more types of metal. Non-limiting examples of suitable metals include silver, gold, copper, nickel, gold-plated silver, platinum, and palladium. Non-limiting examples of conductive structures include nanowires (e.g. metal), meshes (e.g. metal), nanotubes (e.g. carbon nanotubes), conductive oxides (e.g. indium tin oxide), graphene, and conductive polymer fibers.

Such conductive structures can be any shape or geometry, such as nanowires, particles, nanotubes, and nanorods. The conductive structures may be nano-sized structures (i.e. conductive nanostructures), where at least one dimension (e.g. diameter, length, or width) of the conductive structures is less than 500 nm, or in some cases, less than 100 nm or 50 nm. For example, silver nanowires may have diameter ranges of 10 nm to 120 nm, 25 nm to 35 nm, 30 to 33 nm, 35 nm to 45 nm, 55 nm to 65 nm, or 80 to 120 nm. Such silver nanowires may have average diameters of 30 nm, 40 nm, 60 nm, or 90 nm. Such silver nanowires may have lengths greater than 500 nm, 1 μm, or 10 μm.

In an exemplary embodiment, the conductive structures may comprise silver nanowires. The silver nanowires may be used for imparting electrical conductivity to the conductive films, and to the articles prepared using the conductive films. The electrical conductivity of the silver nanowire based transparent conductive film is mainly controlled by a) the conductivity of a single nanowire, b) the number of nanowires between the terminals, and c) the number of connections and the contact resistivity between the nanowires. Below a certain nanowire concentration (also referred as the percolation threshold), the conductivity between the terminals is zero, as there is no continuous current path provided because the nanowires are spaced too far apart and the network becomes discontinuous. Above this concentration, there is at least one current path available. As more current paths are provided, the overall resistance of the layer will decrease. However, as more current paths are provided, the clarity (i.e., percent light transmission) of the conductive film decreases due to light absorption and back scattering by the nanowires. Also, as the amount of silver nanowires in the conductive film increases, the haze of the transparent film increases due to light scattering by the silver nanowires. Similar effects will occur in transparent articles prepared using the conductive films.

In one embodiment, the silver nanowires have aspect ratio (length/width) of from about 20 to about 3300. In another embodiment, the silver nanowires have an aspect ratio (length/width) of from about 500 to 1000. Silver nanowires having a length of from about 5 µm to about 100 µm (micrometer) and a width of from about 10 nm to about 200 nm are useful. Silver nanowires having a width of from about 20 nm to about 100 nm and a length of from about 10 µm to about 50 µm are also particularly useful for construction of a transparent conductive film.

Silver nanowires can be prepared by known methods in the art. In particular, silver nanowires can be synthesized through solution-phase reduction of a silver salt (e.g., silver nitrate) in the presence of a polyol (e.g., ethylene glycol or propylene glycol) and poly(vinyl pyrrolidone). Large-scale production of silver nanowires of uniform size can be prepared according to the methods described in, e.g., Ducamp-Sanguesa, C. et al, *J. of Solid State Chemistry*, (1992), 100, 272-280; Sun, Y. et al., *Chem. Mater.* (2002), 14, 4736-4745, Sun, Y. et al., *Nano Letters*, (2003), 3(7), 955-960; US patent application publication 2012/0063948, published Mar. 15, 2012; US patent application publication 2012/0126181, published May 24, 2012; US patent application publication 2012/0148436, published Jun. 14, 2012; U.S. Pat. No. 8,551,211 to Ollmann et al.; and US patent application publication 2012/0328469, published Dec. 27, 2012, each of which is incorporated by reference in its entirety.

Matrix

Matrix, which may also be referred to as binder in some cases, refers to a material in which conductive structures (e.g. silver nanowires) are embedded or dispersed. The conductive structures and the matrix form the conductive layer disposed on a substrate that makes up the film. The matrix may provide structural integrity to the conductive layer.

For a practical manufacturing process for conductive films, it is important to have both the conductive components, such as silver nanowires, and a polymer binder in a coating solution. The polymer binder solution serves a dual role, as dispersant to facilitate the dispersion of silver nanowires and as a viscosifier to stabilize the silver nanowire coating dispersion so that the sedimentation of silver nanowires does not occur at any point during the coating process. It is also desirable to have the silver nanowires and the polymer binder in a single coating dispersion. This simplifies the coating process and allows for a one-pass coating, and avoids the method of first coating bare silver nanowires to form a weak and fragile film that is subsequently over-coated with a polymer to form the transparent conductive film.

In order for a transparent conductive film to be useful in various device applications, it is also important for the polymer binder of the transparent conductive film to be optically transparent and flexible, yet have high mechanical strength, good hardness, high thermal stability, and light stability. This requires polymer binders to be used for transparent conductive film to have Tg (glass transition temperature) greater than the use temperature of the transparent conductive film. It may also be useful to select polymer binders to have similar coefficients of thermal expansion as those of other materials in the transparent conductive film.

Examples of suitable polymeric binders include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET), polybutylene terephthalate, and polyethylene naphthalate), polymers with a high degree of aromaticity such as phenolics or cresol-formaldehyde (NOVOLACS®), polystyrenes, polyvinyltoluene, polyvinylxylene, polyimides, polyamides, polyamideimides, polyetheramides, polysulfides, polysulfones, polyphenylenes, and polyphenyl ethers, polyurethane (PU), polycarbonates, epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyvinylacetates, polynorbornenes, synthetic rubbers (e.g. EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., LUMIFLON®), and amorphous fluorocarbon polymers or copolymers (e.g., CYTOP® by Asahi Glass Co., or TEFLON® AF by Du Pont), polyvinylbutryals, polyvinylacetals, gelatins, polysaccharides, and starches.

In certain embodiments, in order to disperse and stabilize silver nanowires in polymeric coating solution, the use of polymer binders having high oxygen content is advantageous. Oxygen-containing groups, such as hydroxyl group and carboxylate groups have a strong affinity for binding to the silver nanowire surface and facilitate the dispersion and stabilization. Many oxygen-rich polymers also have good solubility in the polar organic solvents commonly used to prepare organic solvent-coated materials, while other oxygen-rich polymers have good solubility in water or the aqueous solvent mixtures commonly used to prepare aqueous solvent-coated materials.

In certain embodiments, cellulose ester polymers, such as cellulose acetate butyrate (CAB), cellulose acetate (CA), or cellulose acetate propionate (CAP) are superior to other oxygen-rich polymer binders when used to prepare silver nanowire based transparent conductive films that are coated from organic solvents such as 2-butanone (methyl ethyl ketone, MEK), methyl iso-butyl ketone, acetone, methanol, ethanol, 2-propanol, ethyl acetate, propyl acetate, butyl acetate, or mixtures thereof. Their use results in transparent conductive films in which both the optical light transmittance and electrical conductivity of the coated films are greatly improved. In addition, these cellulose ester polymers have glass transition temperatures of at least 100° C. and provide transparent, flexible films having high mechanical strength, good hardness, high thermal stability, and light stability.

The cellulose ester polymers can be present in from about 40 to about 90 wt % of the dried transparent conductive films. Preferably, they are present in from about 60 to about 85 wt % of the dried films. In some constructions, a mixture of a cellulosic ester polymer and one or more additional polymers may be used. These polymers should be compatible with the cellulosic polymer. By compatible, it is meant that a mixture comprising at least one cellulosic ester polymer and one or more additional polymers forms a transparent, single phase composition when dried. The additional polymer or polymers can provide further benefits such as promoting adhesion to the support and improving hardness and scratch resistance. As above, total wt % of all polymers is from about 40 to about 95 wt % of the dried transparent conductive films. Preferably, the total weight of all polymers is from about 60 to about 85 wt % of the dried films. Polyester polymers, urethanes, and polyacrylics are examples of additional polymers useful for blending with cellulosic ester polymers.

In other embodiments, water soluble polymer binders can also be used, such as polyvinyl alcohol, gelatin, polyacrylic acid, polyimides. Other water dispersible latex polymers can also be used such as polyacrylates and polymethacrylates containing methyl acrylic acid units. Coating from aqueous solutions can benefit the environment and reduce the emission of volatile organic compounds during manufacturing.

The use of water soluble polymers, such as polyvinyl alcohol or gelatin as binders for silver nanowire based transparent conductors results in superior transparent conductive films in which both film transmittance and conductivity are greatly improved. Transparent conductive films prepared using either polyvinyl alcohol or gelatin polymer binders also show excellent clarity, scratch resistance, and hardness when polymer cross linkers are added to the polymer solution. Transparent conductive films prepared according methods disclosed in this application provide transmittance of at least 80% across entire spectrum range of about 350 nm to about 1100 nm, and surface resistivity of 500 ohm/sq or less.

The transparent conductive articles comprising silver nanowires and water soluble polymer binders also show excellent clarity, high scratch resistance, and hardness. In addition, transparent conductive films prepared using these polymer binders have good adhesion to supports comprising polyethylene terephthalate (PET), poly(methylmethacrylate), polycarbonate, and the like, when an appropriate subbing layer is applied between the support and the conductive layer. The water soluble polymer binders are present in from about 40 to about 95 wt % of the dried transparent conductive films. Preferably, they are present in from about 60 to about 85 wt % of the dried films.

In some constructions, up to 50 wt % of the gelatin or polyvinyl alcohol polymer binder can be replaced by one or more additional polymers. These polymers should be compatible with the gelatin or polyvinyl alcohol polymer binder. By compatible, it is meant that the all polymers form a transparent, single phase mixture when dried. The additional polymer or polymers can provide further benefits such as promoting adhesion to the support and improving hardness and scratch resistance. Water soluble acrylic polymers are particularly preferred as additional polymers. Examples of such polymers are polyacrylic acid and polyacrylamides, and copolymers thereof. As above, total wt % of all polymers is from about 50 to about 95 wt % of the dried transparent conductive films. Preferably, the total weight of all polymers is from about 70 to about 85 wt % of the dried films.

If desired, scratch resistance and hardness of the transparent conductive films with these polymer binders to the support can be improved by use of crosslinking agents to crosslink the polymer binders. Isocyanates, alkoxyl silanes, and melamines are examples of typical crosslinking agents for cellulose ester polymers containing free hydroxyl groups. Vinyl sulfones and aldehydes are examples of typical crosslinking agents for gelatin binders.

Flexible Film

In some embodiments, the protective film comprises a conductive layer interposed between a first flexible film and a second flexible film. By "flexible," we mean that the support, layer, film, or article can be bent 30 degrees from its original position without requiring or creasing and released to recover at least part of its original shape without loss of electrical continuity and without forming visible discontinuities as detected by the naked eye at a distance of about 0.25 meters. Either or both of the first flexible film or the second flexible film may be formed from an insulative material to protect the conductive layer and the enclosed article from environmental elements, such as electrostatic discharge. The first flexible film may be made from the same or different material as the second flexible film. The first flexible film and/or the second flexible film may be made from a polymeric material. In some embodiments, the first flexible film and/or the second flexible film may be made from a thermosetting polymer, such as, for example, polyurethanes, polyester fiberglass, vulcanized rubber, Bakelite, duroplast, urea-formaldehyde foam, melamine, epoxy, polyimide, cyanate esters or polycyanurates, polyester resins, etc.

Protected Article

Figure 2:
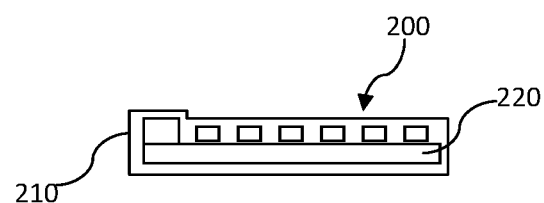
FIG. 2 is a side view of an electronic circuit board enclosed in a protective film.

FIG. 2 is a side view of a package 200 comprising an electronic circuit board 220 enclosed in a protective film 210. The protective film 210 may be formed as a conformal coating that closely conforms to the shape and contours of the article it encloses (e.g. electronic circuit board). The protective film may be applied to the electronic circuit board using various methods, such as thermal lamination, dip coating, brush coating, spray coating, etc. In some embodiments, the conductive layer is laminated between the first flexible film and the second flexible film to form the protective film. In some embodiments, the protective film is laminated to the electronic circuit board. The formation of the protective film on the electronic circuit board (e.g. complete enclosing of the electronic circuit board, partial enclosing of the electronic circuit board by enclosing some of the components of the electronic circuit board) may be performed in a vacuum to create a tight seal between the protective film and the electronic circuit board.

The protective film may package an electronic circuit board with components sensitive to electrostatic discharge. The package may rest on a grounded or static dissipative surface. As a body (e.g. finger) approaches to touch the package, a spark discharge to the package can occur. A conductive layer having a lower surface resistivity may provide better protection to the electronic circuit board against electrostatic discharge than a conductive layer having a higher surface resistivity. For a lower resistivity package, more charge must flow for a longer time to attain the surface voltage of a higher resistivity package, such that more time is available for charge to dissipate from the body. The greater the amount of charge removed from the body, the more the voltage of the body is reduced. In some embodiments, the conductive layer may have a surface resistivity of no more than about 50 ohms/sq. In some embodiments, the first flexible film and/or the second flexible film may be formed from an insulative or dielectric material. When a charged body touches the package, the insulative material will prevent a spark from generating because the insulative material will not conduct.

System Security

Two approaches to dealing with system security include delaying access to the electronic circuit board and executing procedures for dealing with tampering of an electronic circuit board. As discussed above, the protective film may be designed to be impenetrable by certain electromagnetic emissions from the electronic circuit board to prevent their interception, and possibly their decoding or decrypting to reveal sensitive information. The protective film may also be designed to work with the processor of the electronic circuit board to determine whether there has been tampering (e.g. access, probing, or damage) of the electronic circuit board. An electrical contact may connect the protective film with the processor of the electronic circuit board. To prevent or delay capture of components from the electronic circuit board, the electronic circuit board may be preprogrammed with instructions to self-destruct or self-erase any stored information based on detection of changes to the protective film by the processor. For example, a boot sequence may check the integrity of the enclosure and initiate the erasure upon failure of the check.

Figure 3:
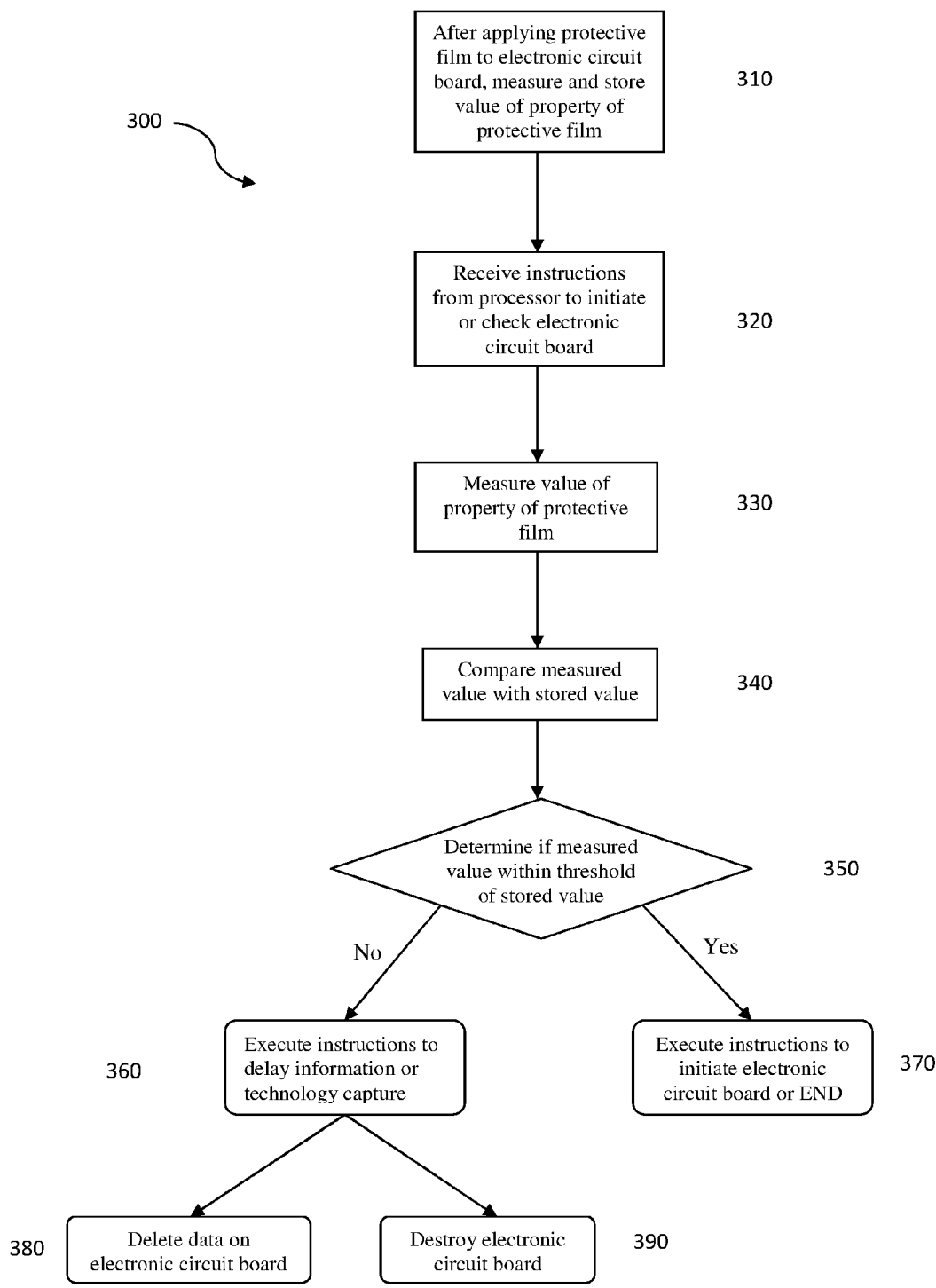
FIG. 3 is a flow chart of a tampering identification and remediation process for a package having an electronic circuit board enclosed in a protective film.

FIG. 3 is a flow chart of a tampering identification and remediation process for a package having an electronic circuit board enclosed in a protective film. The identification and remediation process 300 begins with applying a protective film to the electronic circuit board and measuring a property of the protective film and storing the value in the processor of the electronic circuit board without losing possession of the package in the interim 310. For example, a patterned conductive layer may have different regions exhibiting different resistivity (e.g. conductivity) or capacitance values that can be measured during manufacture of the package. This creates an identification or signature for the electronic circuit board, allowing the electronic circuit board to determine probing or damage. If the processor receives instructions to initiate (e.g. boot up or start up) the electronic circuit board or check on the electronic circuit board for tampering 320, the system measures the value of the property of the protective film 330 (e.g. resistivity, conductivity, and/or capacitance values). This is done prior to initiating the electronic circuit board if that was the instruction received in 320. Subsequently, the processor compares 340 the measured value obtained (e.g. resistivity, conductivity, and/or capacitance values) in 330 with the stored value 310 and determines if the measured value is within the predetermined acceptable threshold of the stored valued 350. If the measured value is within the threshold of the stored value and the instructions from the processor is to initiate the electronic circuit board in 320, then the instructions to initiate the electronic circuit board is executed 370. If the measured value is within the threshold of the stored value and the instructions from processor is to check the electronic circuit board (e.g. for tampering, etc.), then the instruction in 320 has been completed and the process ends. If the measured value is not within the predetermined acceptable threshold of the stored value, pre-programmed instructions to delay information or technology capture is executed 360. Preprogrammed instructions may include selective or comprehensive deletion of information stored on the electronic circuit board 380 or destroying the electronic circuit board 390 to prevent or delay of information or technology capture. In some cases, if the measured and stored values are not within the threshold, the electronic circuit board may have other issues other than tampering, such as corrosion. In any event, it may be prudent to destroy the package or delete data stored within it. If the package is accessible, the authorized operator may delay execution of instructions to delay information or technology capture and retrieve the package.

To determine whether the package has been tampered with, any of the following properties of the protective film may be measured prior to applying the film to the electronic circuit board and after the film has been applied and the package has been out of possession: impedance, resistance, conductivity, capacitance, etc. The predetermined threshold between the measured and stored value may be within 10% of each other, 5% of each other, etc. In some embodiments, the protective film may be transparent or invisible to the naked eye to conceal the ability of the protective film to prevent tampering from intruders.

EXEMPLARY EMBODIMENTS

U.S. Provisional Application No. 62/106,264, filed Jan. 22, 2015, entitled "NANOWIRE SECURITY FILMS," which is hereby incorporated by reference in its entirety, disclosed the following fifteen non-limiting exemplary embodiments:

A. An article comprising:
an enclosed area at least partially surrounded by a visible light-transmissive protective film comprising a first visible light-transmissive flexible film, a second visible light-transmissive flexible film, and a visible light-transmissive patterned conductive layer interposed between the first visible light-transmissive flexible film and the second visible light-transmissive flexible film, the visible light-transmissive conductive layer comprising a dispersion of metal nanowires within a polymeric matrix having an average pore size among metal nanowires that is impenetrable by electromagnetic radiation having a wavelength greater than 1 mm.

B. The article according to embodiment A, wherein the enclosed area is completely enclosed within the visible light-transmissive protective film.

C. The article according to embodiment A, wherein the enclosed area comprises at least one electronic circuit.

D. The article according to embodiment A, wherein the enclosed area comprises an electronic circuit board, and wherein the electronic circuit board contacts the visible light-transmissive protective film in at least one point of contact.

E. The article according to embodiment A, wherein the enclosed area comprises an electronic circuit board, and wherein the electronic circuit board contacts the visible light-transmissive protective film.

F. The article according to embodiment A, wherein the enclosed area comprises an electronic circuit board, and wherein the electronic circuit board continuously contacts surfaces of the visible light-transmissive film.

G. A method of using an electronics circuit board at least partially surrounded by a visible light-transmissive protective film comprising a first visible light-transmissive flexible film, a second visible light-transmissive flexible film, and a visible light-transmissive patterned conductive layer interposed between the first visible light-transmissive flexible film and the second visible light-transmissive flexible film, the visible light-transmissive conductive layer comprising a dispersion of metal nanowires within a polymeric matrix, the method comprising:
comparing a measured value of a property of the visible light-transmissive protective film after receiving an instruction from the electronics circuit board with a stored value of the property of the visible light-transmissive protective film prior to receiving the instruction, and
determining whether the measured value of the property is within a predetermined threshold of the stored value of the property.

H. The method of embodiment G, further comprising:
preventing access to data stored on the electronics circuit board if the measured value of the property is outside the predetermined threshold of the stored value of the property.

J. The method of embodiment G, further comprising:
deleting data stored on the electronics circuit board if the measured value of the property is outside the predetermined threshold of the stored value of the property.

K. The method of embodiment G, further comprising:
destroying the electronics circuit board if the measured value of the property is outside the predetermined threshold of the stored value of the property.

L. The method of embodiment G, wherein the predetermined threshold is 10% of the stored value of the property.

M. The method of embodiment G, wherein the predetermined threshold is 5% of the stored value of the property.

N. The method of embodiment G, wherein the property is impedance.

P. The method of embodiment G, wherein the property is resistance.

Q. The method of embodiment G, wherein the property is capacitance.

The invention has been described in detail with reference to specific embodiments, but it will be understood that variations and modifications can be effected within the spirit and scope of the invention. The presently disclosed embodiments are therefore considered in all respects to be illustrative and not restrictive. The scope of the invention is indicated by the attached claims, and all changes that come within the meaning and range of equivalents thereof are intended to be embraced therein.

What is claimed:

1. An article comprising:
an enclosed area at least partially surrounded by a visible light-transmissive protective film comprising a first visible light-transmissive flexible film, a second visible light-transmissive flexible film, and a visible light-transmissive patterned conductive layer interposed between the first visible light-transmissive flexible film and the second visible light-transmissive flexible film, the visible light-transmissive conductive layer comprising a dispersion of metal nanowires within a polymeric matrix having an average pore size among metal nanowires that is impenetrable by electromagnetic radiation having a wavelength greater than 1 mm.

2. The article according to claim 1, wherein the enclosed area is completely enclosed within the visible light-transmissive protective film.

3. The article according to claim 1, wherein the enclosed area comprises at least one electronic circuit.

4. The article according to claim 1, wherein the enclosed area comprises an electronic circuit board, and the electronic circuit board contacts the visible light-transmissive protective film in at least one point of contact.

5. The article according to claim 1, wherein the enclosed area comprises an electronic circuit board, and the electronic circuit board contacts the visible light-transmissive protective film.

6. The article according to claim 1, wherein the enclosed area comprises an electronic circuit board, and the electronic circuit board continuously contacts surfaces of the visible light-transmissive film.

7. A method of using an electronics circuit board at least partially surrounded by a visible light-transmissive protective film comprising a first visible light-transmissive flexible film, a second visible light-transmissive flexible film, and a visible light-transmissive patterned conductive layer interposed between the first visible light-transmissive flexible film and the second visible light-transmissive flexible film, the visible light-transmissive conductive layer comprising a dispersion of metal nanowires within a polymeric matrix, the method comprising:
comparing a measured value of a property of the visible light-transmissive protective film after receiving an instruction from the electronics circuit board with a stored value of the property of the visible light-transmissive protective film prior to receiving the instruction, and
determining whether the measured value of the property is within a predetermined threshold of the stored value of the property.

8. The method of claim 7, further comprising:
preventing access to data stored on the electronics circuit board if the measured value of the property is outside the predetermined threshold of the stored value of the property.

9. The method of claim 7, further comprising:
deleting data stored on the electronics circuit board if the measured value of the property is outside the predetermined threshold of the stored value of the property.

10. The method of claim 7, further comprising:
destroying the electronics circuit board if the measured value of the property is outside the predetermined threshold of the stored value of the property.

11. The method of claim 7, wherein the predetermined threshold is ±10% of the stored value of the property.

12. The method of claim 7, wherein the predetermined threshold is ±5% of the stored value of the property.

13. The method of claim 7, wherein the property is selected from the group consisting of impedance, resistance, or capacitance.

14. The method of claim 13, wherein the property is impedance.

15. The method of claim 13, wherein the property is resistance.

16. The method of claim 13, wherein the property is capacitance.

* * * * *